(12) United States Patent
Verhoeven

(10) Patent No.: US 6,225,872 B1
(45) Date of Patent: May 1, 2001

(54) RESONATOR HAVING A SELECTION CIRCUIT FOR SELECTING A RESONANCE MODE

(75) Inventor: Christiaan Johannes Maria Verhoeven, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 09/403,567
(22) PCT Filed: Apr. 24, 1998
(86) PCT No.: PCT/NL98/00229
  § 371 Date: Nov. 5, 1999
  § 102(e) Date: Nov. 5, 1999
(87) PCT Pub. No.: WO98/48511
  PCT Pub. Date: Oct. 29, 1998

(30) Foreign Application Priority Data

Apr. 24, 1997 (NL) ................................ 1005895

(51) Int. Cl.⁷ ............................ H03B 5/24; H03B 5/36
(52) U.S. Cl. .............. 331/143; 331/116 R; 331/144; 331/145; 331/151; 331/158
(58) Field of Search ................ 331/111, 116 R, 331/116 FE, 143–145, 151, 158

(56) References Cited

U.S. PATENT DOCUMENTS 3,581,235  *  5/1971  Siu ........................................ 331/113
3,961,284     6/1976  Flora .

FOREIGN PATENT DOCUMENTS 20 65 090     4/1972  (DE) .
54-157461    12/1979  (JP) .

OTHER PUBLICATIONS

R. Hofer, "Schnelle Komparatoren Sinnvoll Eingesetzt", *Elektronik*, vol. 35, No. 12, Jun. 1986, pp. 76–78.

* cited by examiner

*Primary Examiner*—David Mis
(74) *Attorney, Agent, or Firm*—Young & Thompson

(57) ABSTRACT

A resonator includes a resonating device and a selection circuit for selecting a resonance mode. The selection circuit is formed by a first-order oscillator which is provided with a synchronization input and whose output is connected to the excitation input of a resonator, the output of the resonator being connected to the synchronization input of the first-order oscillator in order to synchronize the oscillator and the output signal of the resonator being derived from the oscillator.

6 Claims, 3 Drawing Sheets

RESONATOR HAVING A SELECTION CIRCUIT FOR SELECTING A RESONANCE MODE

BACKGROUND OF THE INVENTION

The invention relates to a resonator having a resonating device and a selection circuit for selecting a resonance mode, the selection circuit being formed by a first-order oscillator.

DESCRIPTION OF THE RELATED ART

In standard electronic systems, resonator oscillators are designed by using the known negative impedance structure, such as is described, for example, in the PhD thesis entitled "Design of High-Performance Negative-Feedback Oscillators" by C.A.M. Boon published in the Delft University of Technology in 1989 and in the article entitled "Low-Noise Oscillators" by J. H. Huijsing et al. published in "Analog Circuit Design" by Kluwer Academic Publishers in 1996.

In generally known resonators, a desired resonance mode is selected by means of a tuned circuit.

The resonators used hitherto have the disadvantage that resonant circuits are expensive and fragile compared with other components in an electronic circuit and, in addition, are difficult to integrate with the desired requirements.

From Patents Abstract of Japan, vol. 4, no. 18 (E-171), Feb. 13, 1980 & Japan 54 157461 A, Dec. 12, 1979 a resonator provided with a resonating device in form of a piezoelectric element is known. A resonance mode is selected by using a monostable multivibrator, of which the pulse direction is selected. Said multivibrator is not a first-order oscillator, whereas the type of selection is completely different from that of the resonator of this invention. Moreover, in the prior art resonator it is only aimed to secure the minimum natural oscillation number of the piezoelectric element and not an overtone mode.

The U.S. Pat. No. 3,581,235 discloses a resonator comprising a crystal and an stable multivibrator consisting of two transistors with resistive cross-coupling. By this kind of cross-coupling the crystal has an impedance influence on the stable multivibrator in contrast to the threshold influence in the resonator according to the invention.

SUMMARY OF THE INVENTION

The object of the invention is to provide a resonator of the type mentioned in the preamble which is improved with respect to known resonators, the abovementioned disadvantages being eliminated and the problem of subordinate resonances and that of direct breakthrough being avoided, while it is readily possible to excite resonators in a higher mode.

This object is achieved, according to the invention in that the oscillator comprises a capacitor and a switchable current source which is connected thereto by a control input for the alternating charging and discharging of said capacitor, and two comparators, first inputs of which are connected to the connection point of the capacitor and the switchable current source, other inputs of which are each connected to a reference source, and the output of which is connected to a memory circuit whose output signal is at a first level if the one comparator delivers an output signal and is at a second level if the second comparator delivers an output signal, wherein the output of the memory circuit is connected to the input of the resonating device and the control input of the switchable current source and wherein the output signal of the resonating device modulates the reference sources.

The different operation of the known resonator with respect to the resonator according to present invention appears from the requirement that the natural frequency of the multivibrator must be slightly higher than the resonant frequency of the crystal, whereas that of the first-order oscillator of present invention must only be nearly equal to the resonant frequency of the crystal, i.e. both slightly higher or slightly lower than said resonant frequency or a higher harmonic thereof.

The natural frequency of the first-order oscillator may be chosen as almost equal to the desired frequency of the output signal of the resonator. When synchronization is reached, the frequency generated is ultimately completely determined by the resonating device.

Choosing the natural frequency of the first-order oscillator by means of its frequency-determining components enables the range to be set in which synchronization is maintained. In this way, any subordinated resonance of the resonator can be selected.

In one embodiment, an amplifier is incorporated between the output of the resonating device and the reference sources of the first-order oscillator in order to obtain a synchronization sensitivity of the oscillator which is such that it reliably resonates as an entity at a desired frequency.

Preferably, the output signal of the first-order oscillator is a square wave. Further elaborations of the invention are described in the subsequent claims.

BRIEF DESCRIPTION OF THE DRAWINGS

The invention will be explained in greater detail below by reference to the drawings.

In the drawings.

Figure 1:
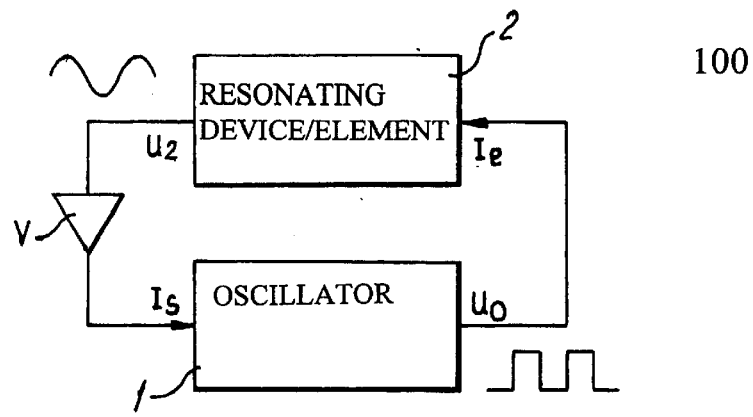
FIG. 1 shows a block diagram of a resonator according to the invention.

The block diagram in FIG. 1 reveals the principle of the invention. The resonator circuit 100 of the invention comprises a resonating device 2 and an oscillator 1. The resonating device may be a quartz crystal or any other device capable of resonating in one or more resonance modes.

The oscillator 1 is of the first order, hereinafter also referred to as relaxation oscillator, and generates a signal whose frequency is determined by frequency-determining components, such as, for example, a capacitor. The frequency of the oscillator 1 is chosen as approximately equal to the desired frequency of the resonator. The output signal appearing at the output $U_o$ of the relaxation oscillator is fed to the excitation input $I_e$ of the resonating device 2. The oscillator output signal preferably has a square form. At the output $U_2$ of the resonating device 2, there must appear a signal whose frequency must be equal to a predetermined desired resonator frequency. Said output signal of the resonating device 2 is fed via an amplifier V to the synchronization input $I_e$ of the relaxation oscillator 1. The synchronization takes place by influencing the points in time of the reversal of the relaxation oscillator.

By limiting the sensitivity of the relaxation oscillator to the synchronizing square wave, it will be dependent on the frequency of the signal originating from the resonating device whether synchronization occurs or not. If synchronization occurs, the resonance will be maintained by supplying energy from the relaxation oscillator. If synchronization does not occur, the resonance will not be maintained by the loop comprising resonating device 2 and oscillator 1. It will thus be possible to maintain desired oscillations, while undesirable subordinate resonances will be suppressed. The desired synchronization range can be adjusted by choosing a suitable natural frequency of the relaxation oscillator as well as choosing the correct sensitivity.

If a square wave is chosen for the output signal of the first-order oscillator, the system will have a high insensitivity to direct breakthrough from the input to the output of the resonator circuit. As a result of the high-pass nature of the direct breakthrough, it will largely be removed prior to the subsequent synchronization of the subsequent reversal of the relaxation oscillator. The incident of synchronization will consequently not depend on the direct breakthrough of the resonator circuit.

A resonating device having a good characteristic has one resonance frequency, the amplitude of the output signal suddenly becoming large and the phase between the input and the output of the resonating device being equal to zero. Resonating devices disclosed hitherto do not meet the above-set requirements because, for example, considerable crosstalk occurs which results in phase differences in the resonating device.

It is only with the resonator according to the invention that the abovementioned problems can be eliminated.

Figure 2:
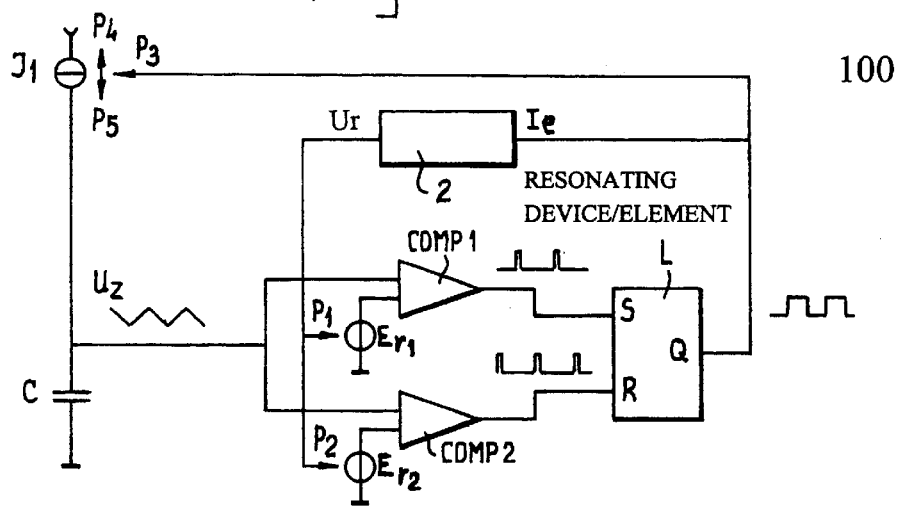
FIG. 2 shows a resonator according to the invention reproduced in greater detail.

A more detailed diagram of the resonator circuit according to the invention is shown in FIG. 2. The resonating device 2 of the resonator is supplemented by a first-order oscillator whose functions are specified separately.

The first-order oscillator or relaxation oscillator has an integration function, a comparison function, a function of switching the sign of the integration and a memory function.

The integration is formed by the capacitor C, which is charged by the current source $I_1$ which is capable of supplying current in two directions. The switching function is shown diagrammatically by the arrows $P_4$ and $P_5$. The capacitor C is charged by means of a current in the one direction, while a current in the other direction will discharge said capacitor. Repeatedly switching over the current source $I_1$ produces a sawtooth voltage $u_z$ at the connecting point between current source $I_1$ and capacitor C. The comparison function is performed by the comparators COMP 1 and COMP 2. The sawtooth voltage $u_z$ is fed to an input both of the comparator COMP 1 and of the comparator COMP 2. Connected to the other inputs of the comparators COMP 1 and COMP 2. Connected to the other inputs of the comparators COMP 1 and COMP 2 are the reference sources $E_{r1}$ and $E_{r2}$.

The memory function is implemented in the embodiment shown by the S–R latch L. The output of the comparator COMP 1 is connected to the input S of the latch L and the output of the comparator COMP 2 to the input R of said latch L. The output Q of the latch is connected to the excitation input $I_o$ of the resonating device 2 and to the control or switching input $P_3$ of the current source $I_1$. The output signal appearing at the output $U_2$ of the resonating device 2 modulates the reference sources $E_{r1}$ and $E_{r2}$, which is shown diagrammatically by the arrows $P_1$ and $P_2$.

The oscillation frequency of the first-order oscillator is determined by the equation:

$$f_{osc} = \frac{1}{4CV_{amp}}$$

where $V_{amp}$ is the amplitude of the sawtooth wave $u_z$ across the capacitor $C_1$ so that the oscillator frequency can be tuned linearly by linearly varying the charging current. The period of the oscillator can be changed linearly by varying linearly the amplitude of the oscillation or the value of the capacitor C.

Since the current is integrated in the capacitor, the oscillator can be synchronized and be locked by modulating the reference sources of the comparators. The output signal of the resonating device can easily be added to the voltage of the reference sources $E_{r1}$ and $E_{r2}$. The circuit is then designed in such a way that the passage of the sine wave from the resonating device through zero synchronizes the first-order oscillator. There are therefore no specific requirements relating to the linearity of the amplifier which processes the resonator output signal and even a simple limiter can be used.

Figure 3:
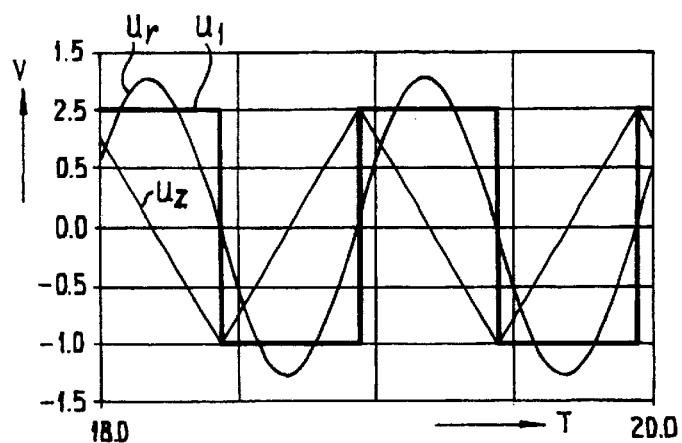
FIG. 3 shows signals at various points in the circuit of FIG. 2.

FIG. 3 shows the characteristic of the resonator circuit by the signals occurring therein. FIG. 3 shows the steady-state oscillation condition of the resonator. In this case, a device resonating at 1 MHz and having a quality factor Q of only 10 is used as resonator. In FIG. 3, the reference symbol $U_1$ indicates the square output signal of the latch, the reference symbol $U_z$ indicates the triangular voltage across the capacitor of the first-order oscillator and the reference symbol $U_r$ indicates the output signal of the resonating device.

From FIG. 3 it is clear that the reversal of the relaxation oscillator from the charging phase to the discharging phase and vice versa is synchronized or triggered by the output voltage of the resonating device.

Non-ideal properties of the components of the circuit, such as mismatching and noise in the charging and discharging currents, mismatching and noise in the reference levels and delays in the synchronization path, may influence the phase relationship of the signals. It has been found that the influence of these non-ideal properties can be effectively eliminated by amplification factors in the synchronization path. For example, an amplifier can be incorporated between the output of the resonating device and the modulation input of the reference sources.

Figure 4:
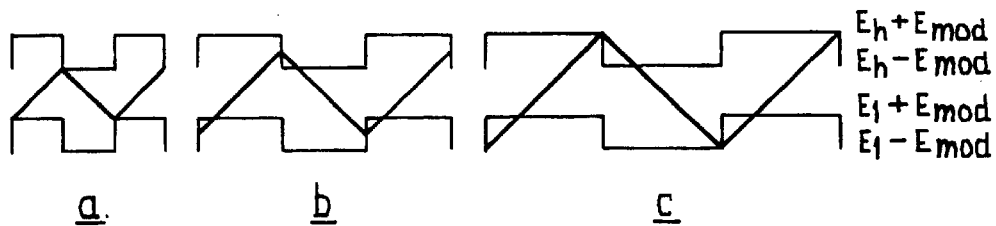
FIG. 4 shows a diagram which reveals the limits of the synchronization capture range.

The limits of the capture range can be derived from FIG. 4. This figure shows three states of the oscillator. In FIG. 4(b), the oscillator is is the center of the capture range. The frequency of the resonating device is now precisely equal to the natural frequency of the first-order oscillator. As stated above, the comparison levels are modulated by the output signal of the resonating device in order to obtain synchronizing square waves. In FIG. 4(a), the first-order oscillator has its highest possible (synchronized) frequency. In FIG. 4(c), however, the oscillator has its lowest possible (synchronized) frequency. It is pointed out that the charging current of the capacitor is identical in all these figures.

The amplitude of the modulation level $E_{mod}$ and the comparator level $E_l$ and $E_n$, which are equal but opposite, are now defined. If the absolute value of $E_l$ and $E_n$ is set equal to E, the capture range of the first-order oscillator is determined by:

$$\frac{1}{4(E+E_{mod})C} < f < \frac{1}{4(E-E_{mod})C}$$

If the resonance of the resonating device is not within these limits, almost all the transistors will be initiated by the first-order oscillator and the system is not synchronized.

Figure 5:
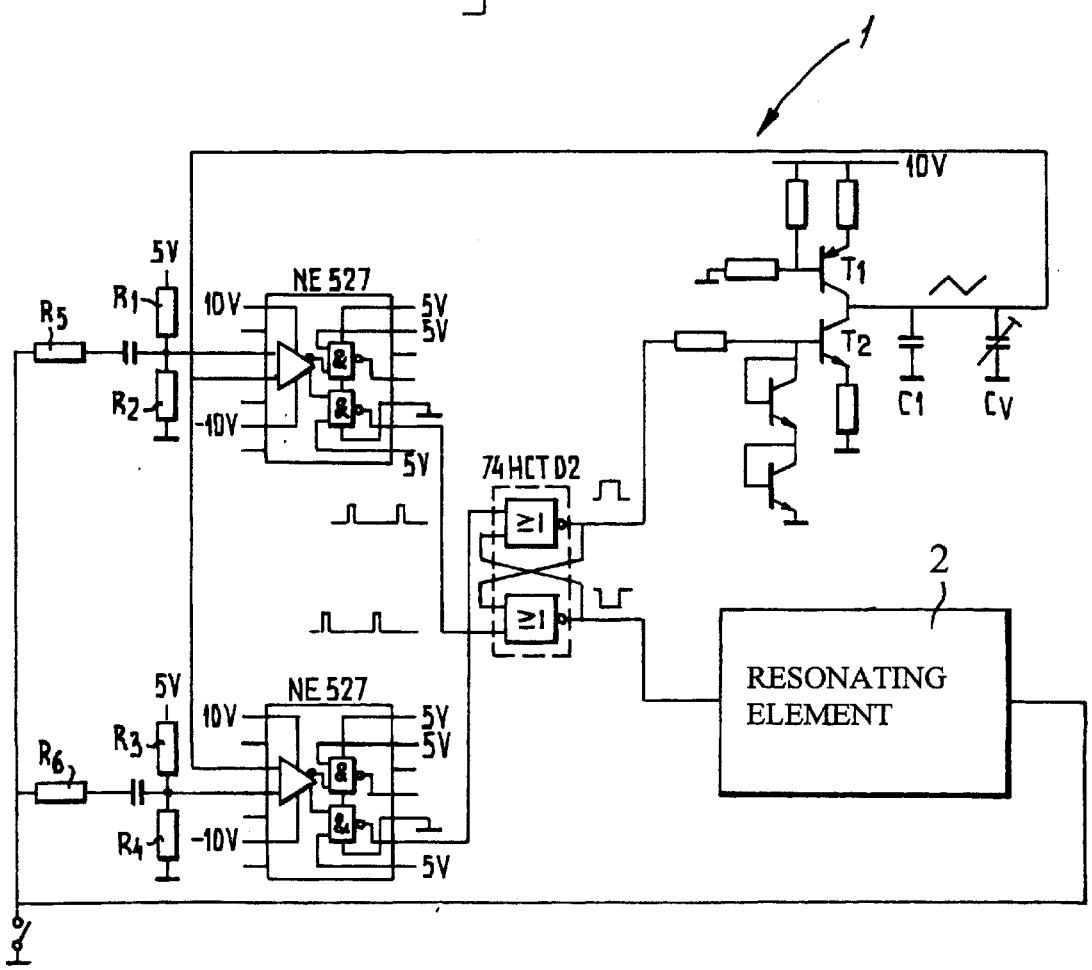
FIG. 5 shows an elaborated diagram of the resonator according to the invention.

FIG. 5 shows a detailed diagram of another resonator circuit according to the invention.

The comparators are implemented by NE527, the latch by 74 HCATO2 and the capacitor is formed by the parallel connection of the capacitors C1 and $C_y$. This capacitor circuit is charged up by the transistor $T_1$ and discharged by the transistor $T_2$. The switching from the charging to the discharging phase and vice versa is controlled by the output signal of the latch, which is fed to the base of the transistor $T_2$.

The comparison levels of the comparators are formed by the voltage dividers comprising the resistors $R_1$ and $R_2$ or $R_3$ and $R_4$, respectively. The output signal of the resonating element 2 is fed via the resistors $R_5$ or $R_6$, respectively, to the connection point of the resistors in the voltage dividers and are, as it were, added to the reference voltages of the comparators set by the voltage dividers.

Figure 6:
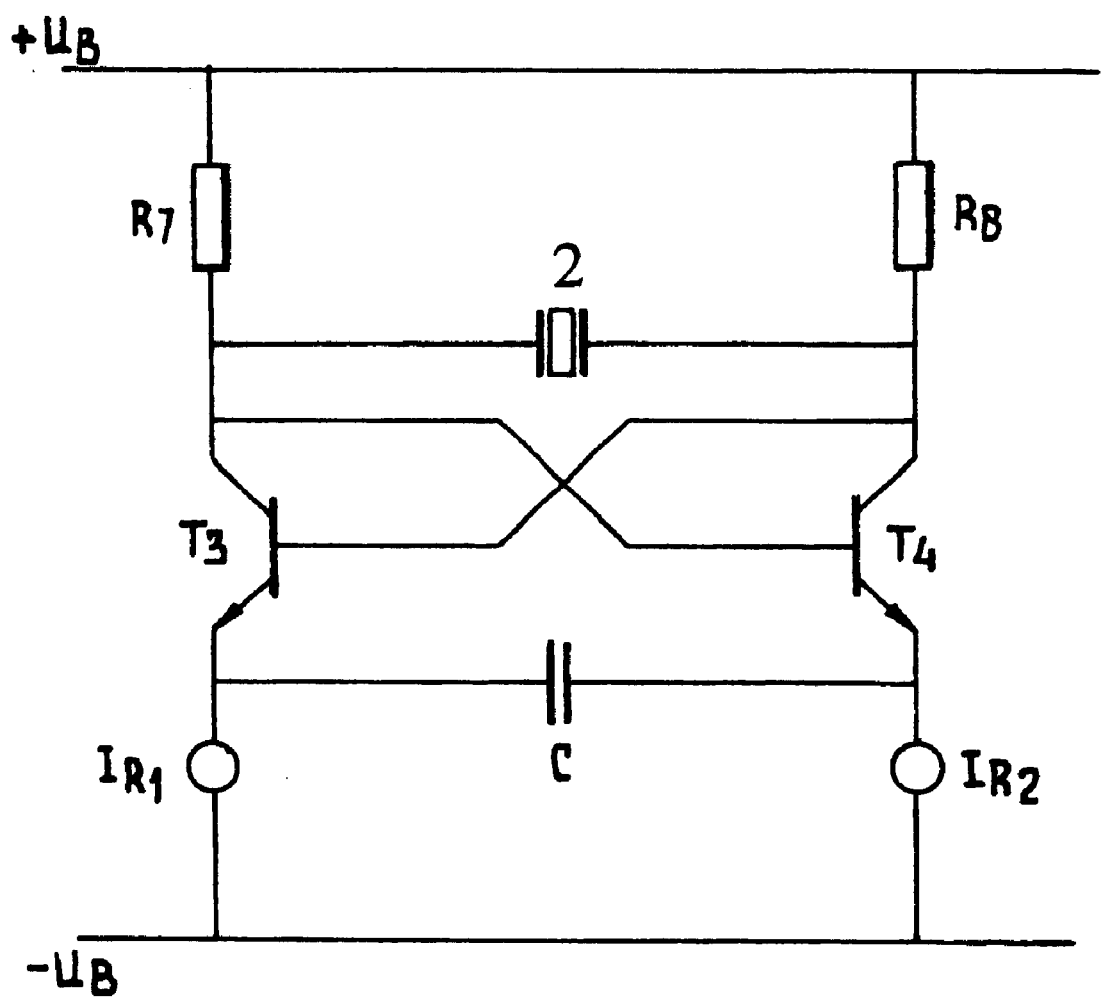
FIG. 6 shows a very simple embodiment of the resonator according to the invention.

FIG. 6 shows a very simple version of a further resonator circuit embodiment according to the invention.

DESCRIPTION OF THE PREFERRED EMBODIMENTS

This embodiment comprises two transistors $T_3$ and $T_4$. The collector of the transistor $T_3$ and the collector of the transistor $T_4$ are connected via the resistors $R_7$ and $R_8$, respectively, to the one polarity of the supply voltage $U_B$. The emitters of the transistors $T_3$ and $T_4$ are connected via reference sources $I_{R1}$ and $I_{R2}$ to the other polarity of the supply voltage $U_B$. Connected between the emitters of the transistors $T_3$ and $T_4$ is the capacitor C as the frequency-determining component of the oscillator. The resonating element is incorporated between the collectors of the transistors $T_3$ and $T_4$. The base of the transistor $T_3$ is connected to the collector of the transistor $T_4$, while the base of the transistor $T_4$ is connected to the collector of the transistor $T_3$.

It has been found that a resonator circuit according to the invention which works very well can be designed by means of only two transistors, one capacitor and a small number of resistors.

The invention can very advantageously be used in crystal oscillators which have to resonate stably in a desired higher mode. The invention is very suitable for this application. Apart from the high stability of the resonator obtained, the resonator circuit has small dimensions and is cheap.

The circuit can be integrated completely, in contrast to the contemporary harmonic oscillators, in which the additional filtering required to allow a resonator to resonate at the desired frequency can at most be integrated partly.

In addition, the circuit is very suitable for inducing two-port resonators, such as those, for example, which can be made by means of micromachining on a chip, to resonate. Said resonators are usually subject to a particularly large amount of trouble due to crosstalk. This trouble belongs to the past in the case of the circuit disclosed.

In addition, the invention is very suitable for inducing resonators which have to be implemented on a chip to resonate. Because of the manner of manufacture, these on-chip resonators often suffer from direct crosstalk (breakthrough), to which crosstalk the resonator according to the invention is very insensitive.

The invention is also suitable for resonating sensors, in particular for applications in which miniature sensors are desired.

What is claimed is:

1. A resonator circuit comprising:

a resonating device (2) and a selection circuit for selecting a resonance mode connected between an input and an output of said resonating device, the selection circuit being formed by a first-order oscillator (1) having a capacitor (C) connected to a switchable current source ($I_1$) by a control input for the alternating charging and discharging of said capacitor, and two comparators (COMP1, COMP2), first inputs of which comparators are connected to a connection point of the capacitor (C) and the switchable current source ($I_1$), second inputs of which comparators are each connected to a reference source (Er1,Er2), and the output of which comparator is connected to a memory circuit (L) whose output signal is at a first level if the one comparator delivers an output signal and is at a second level if the second comparator delivers an output signal, wherein the output of the memory circuit (L) is connected to the input of the resonating device (2) and the control input of the switchable current source ($I_1$) and wherein the output signal of the resonating device (2) modulates the reference sources (Er1, Er2).

2. Resonator circuit according to claim 1, wherein the output signal of the resonating device (2) is added to the voltage of the reference sources (Er1,Er2).

3. Resonator circuit according to claim 1, characterized in that an amplifier is connected between the output of the resonating device (2) and the reference sources (Er1, Er2).

4. Resonator circuit according to claim 1, characterize din that the memory circuit (L) is a latch.

5. A resonator circuit comprising:

a first and a second transistor (T3, T4), two collector of which transistors are connected by a collector resistor (R7, R8) to a first polarity of a supply voltage (UB) and the emitter of which transistors are connected via an emitter resistor to another polarity of the supply voltage (UB), the base of each transistor is connected to the collector of the other transistor, a capacitor (C) located between the emitters of the transistors (T3, T4), and a resonating device (R) connected directly between the collectors of the transistors (T3, T4).

6. Resonator circuit of claim 5, wherein each of the two terminals of the resonating device is also directly connected with a corresponding collector resistor forming two nodes at which one of the resonating device terminals, one transistor collector, and one collector resistor are directly connected together.

* * * * *